United States Patent [19]

Peterson

[11] Patent Number: 4,599,970
[45] Date of Patent: Jul. 15, 1986

[54] APPARATUS FOR COATING A SELECTED AREA OF THE SURFACE OF AN OBJECT

[75] Inventor: Frederick W. Peterson, East Hempsfield Township, Lancaster County, Pa.

[73] Assignee: RCA Corporation, Princeton, N.J.

[21] Appl. No.: 710,275

[22] Filed: Mar. 11, 1985

[51] Int. Cl.$^4$ ............................................. B05C 11/16
[52] U.S. Cl. .................................... 118/504; 118/721; 118/728
[58] Field of Search .............. 118/301, 504, 505, 720, 118/721, 728; 204/298; 269/8

[56] References Cited

U.S. PATENT DOCUMENTS

| | | | |
|---|---|---|---|
| 2,453,582 | 11/1948 | Morgan | 118/721 |
| 3,023,727 | 3/1962 | Theodoseau et al. | 118/9 |
| 3,170,810 | 2/1965 | Kagan | 117/38 |
| 4,266,334 | 5/1981 | Edwards et al. | 29/583 |
| 4,388,128 | 6/1983 | Ogawa et al. | 156/64 |

OTHER PUBLICATIONS

G. Tzanavaras, "Hold–Down Technique for Metal Masks Using Permanent Magnets", IBM Technical Disclosure Bulletin, vol. 20, No. 1, Jun. 1977.

Primary Examiner—John D. Smith
Assistant Examiner—K. E. Jaconetty
Attorney, Agent, or Firm—Birgit E. Morris; Donald S. Cohen

[57] ABSTRACT

An apparatus for use in coating a selected area of a surface of a body, such as a flat disc type body, includes a support member having a recess in one side which is adapted to receive the body and an opening through the bottom of the recess which is smaller than the recess. A cup-shaped cover plate is adapted to fit into the recess in the support member. The cover plate has a bottom which is adapted to engage the body and hold it firmly against the bottom of the recess with the surface of the body to be coated being exposed through the opening in the support member. A mask of a magnetic material is adapted to fit in the opening in the support member against the surface of the body. A permanent magnet is adapted to be seated against the bottom of the cover member and attract the mask to hold the mask against the surface of the body.

7 Claims, 4 Drawing Figures

APPARATUS FOR COATING A SELECTED AREA OF THE SURFACE OF AN OBJECT

The present invention relates to an apparatus for use in coating a selected area of a surface of an object, and more particularly, to an apparatus for coating a selected area of a glass plate mounted on a charge-coupled device (CCD) image sensor with a metal film.

BACKGROUND OF THE INVENTION

A frame transfer CCD image sensor in general includes three sections: a photosensing array, known as the A-register; a temporary storage array, known as the B-register; and an output register, known as the C-register. The three registers are formed along a major surface of a substrate of semiconductor material. It is the practice to mask out the B-register and the C-register so that light from the image being sensed will only impinge upon the A-register. In one type of CCD image sensor the light enters the semiconductor substrate through its surface opposite to the surface along which the registers are formed, which surface is generally referred to as the back surface of the substrate. In order to allow the light to pass readily through the substrate to the A-register, the substrate is thinned from its back surface and a glass plate is mounted on the back surface to provide support for the thin substrate. This type of device is described in U.S. Pat. No. 4,266,334 to T. W. Edwards et al., issued May 12, 1981, entitled "Manufacture of Thinned Substrate Imagers". In this type of imager the mask for the B-register and C-register is a metal film coated on the surface of the glass plate. To apply the masking film to the glass plate, an apparatus is required which will hold the imager and a mask and will allow proper alignment of the mask and the imager.

SUMMARY OF THE INVENTION

An apparatus for coating a selected area of the flat surface of a body includes a support member having a recess in one side which is adapted to receive the body and an opening extending therethrough from the bottom of the recess. The opening is smaller than the bottom of the recess. Means is provided to secure the body against the bottom of the recess with a surface of the body being exposed through the opening. A mask is adapted to fit in the opening against the surface of the body and a magnet is provided to hold the mask against the surface of the body.

DETAILED DESCRIPTION OF PREFERRED EMBODIMENTS

Figure 1:
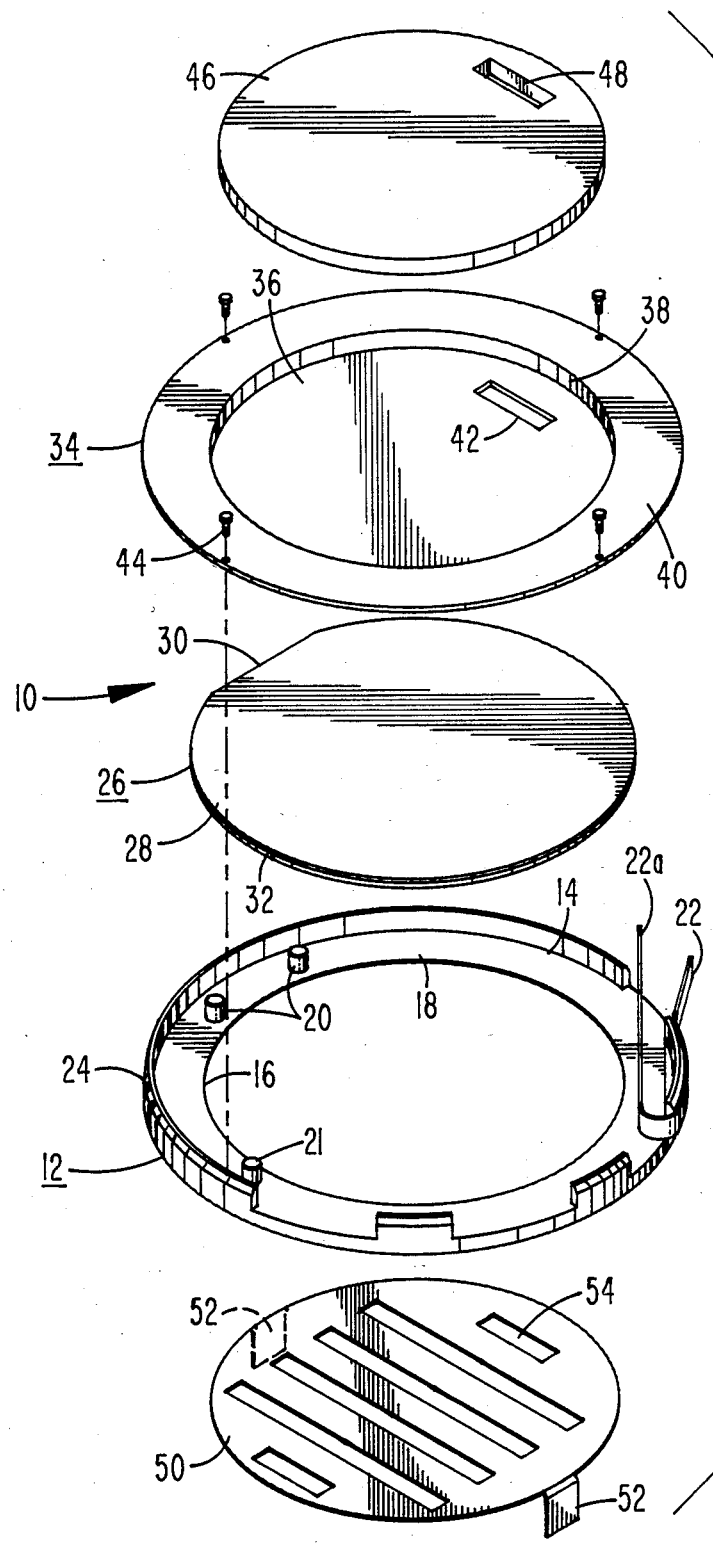
FIG. 1 is an exploded perspective view of the apparatus of the present invention.
Figure 2:
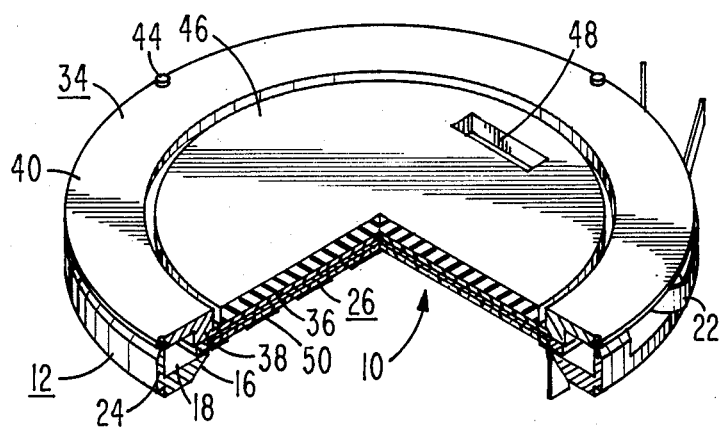
FIG. 2 is a perspective view of the apparatus partialy in section.

Referring initially to FIGS. 1 and 2, one embodiment of the coating apparatus of the present invention is generally designated as 10. The coating apparatus 10 includes a support member 12 in the form of a circular, flat plate having a circular recess 14 in one surface thereof and a circular opening 16 extending through the bottom 18 of the recess 14. The opening 16 is smaller in diameter than the outer diameter of the recess bottom 18. A pair of adjacent but spaced apart alignment pins 20 project from the recess bottom 18 and a third alignment pin 21 projects from the recess bottom 18 spaced about 90° from the alignment pins 20. A leaf spring 22 is mounted on the rim 24 of the recess 14 with one arm 22a extending substantially tangentially across the recess 14. The leaf spring 22 is positioned on the side of the opening 16 substantially opposite the alignment pins 20.

As shown, the object 26 to be coated is a CCD image sensor of the type described in the Edwards et al. U.S. Pat. No. 4,226,334. The object 26 includes a circular flat substrate 28 of a semiconductor material having an alignment flat 30 along its edge, and a glass plate 32 secured to one side of the wafer 28. As shown in the Edwards et al. patent, the glass plate 32 is seated in a recess in the substrate 20 with the outer edge of the glass plate 32 being spaced radially inwardly from the outer edge of the substrate 28. The substrate 28 has formed therein along its exposed surface a plurality of CCD image sensors. The object 26 is mounted in the support member 12 with the outer edge portion of the substrate 28 being seated on the bottom 18 of the recess 14 and the glass plate 32 extending across the opening 16. The flat 30 of the substrate 28 is seated against the pair of alignment pins 20 and the edge of the substrate is seated against the third alignment pin 21. The arm 22a of the spring 22 engages the edge of the object 26 to hold the substrate 28 against the pins 20 and 21.

A cover plate 34 is mounted on the support member 12 over the object 26. The cover plate 34 is cup-shaped having a circular, flat bottom 36, a cylindrical wall 38 and an annular flat rim 40 extending radialy outwardly from the top of the cylindrical wall 38. The bottom 36 has an elongated opening 42 therethrough. The cylindrical wall 38 is of a length so that when the cover member is mounted on the support member 12, the bottom 36 engages the surface of the object 26 and holds it firmly against the bottom 18 of the recess 14. The cover member 34 is secured to the support member 12 by screws 44 which extend through the rim 40 and are threaded into the rim 24 of the support member 12. Thus, the cover member 34 secures the object 26 in the support member 12. The opening 42 is positioned so that part of the CCD image sensors on the object 26 can be viewed through the opening 42.

A flat circular disk 46 of a permanent magnet material is adapted to be seated on the bottom 36 of the cover plate 34. The magnet disk 46 has an elongated opening 48 therethrough. The opening 48 is of a size and is positioned so that it can be arranged in direct alignment with the opening 42 in the bottom 36 of the cover plate 34.

A mask 50 is used to delineate the area of the surface of the object 26 to be coated. The mask 50 is a thin circular plate of a material which can be attracted by a magnet. The mask 50 is of a diameter slightly less than the diameter of the opening 16 in the support member bottom 18. The mask 50 has a pair of tabs 52 projecting therefrom and a plurality of openings 54 therethrough. The openings 54 are of a size and are arranged to expose the exact areas of the object 26 which are to be coated. The tabs 52 allow for handling the mask 50.

To coat selective areas of the surface of the object 26 using the apparatus 10 of the present invention, the object 26 is placed in the recess 14 of the support member 12 with the outer portion of the surface to be coated being seated on the bottom 18 of the recess and with the major portion of the surface to be coated being exposed through the opening 16. The flat 30 of the object 26 is seated against the alignment pins 20 and the spring 22 holds the object 26 against the pins 20. The cover plate 34 is placed in the recess 14 with the bottom 36 engaging the object 26. The cover plate 34 is secured to the support member 12 by the screws 44 to firmly hold the object 26 against the bottom 18 of the support member recess 14. The magnet 46 is placed on the cover plate 34 with the opening 48 being aligned with the opening 42 in the cover plate. Holding the mask 50 by the tabs 52 the mask 50 is placed in the support member opening 16 against the surface of the object 22. The magnet 46 will attract the mask 50 and hold it firmly against the surface of the object 26.

By shining a light through the openings 54 in the mask 50, and viewing the object 26 through the aligned openings 42 and 48 in the cover plate 34 and magnet 46 respectively, such as with a microscope, the mask 50 can be moved about by means of the tabs 52 until one of the openings 54 is in alignment with the appropriate area of the object 26 to be coated. The magnet 46 will then hold the mask 50 in this desired position. The support member 12 can then be placed in a suitable coating chamber for applying a coating of a material on the selected areas of the object 26 exposed by the openings 54 in the mask 50. This coating operation can be achieved by any well known process, such as by evaporation in a vacuum or by sputtering.

Figure 3:
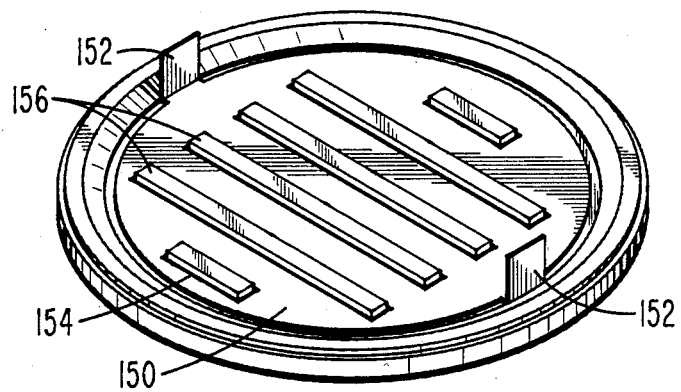
FIGS. 3 and 4 are perspective views showing a modification of the method of the present invention.
Figure 4:
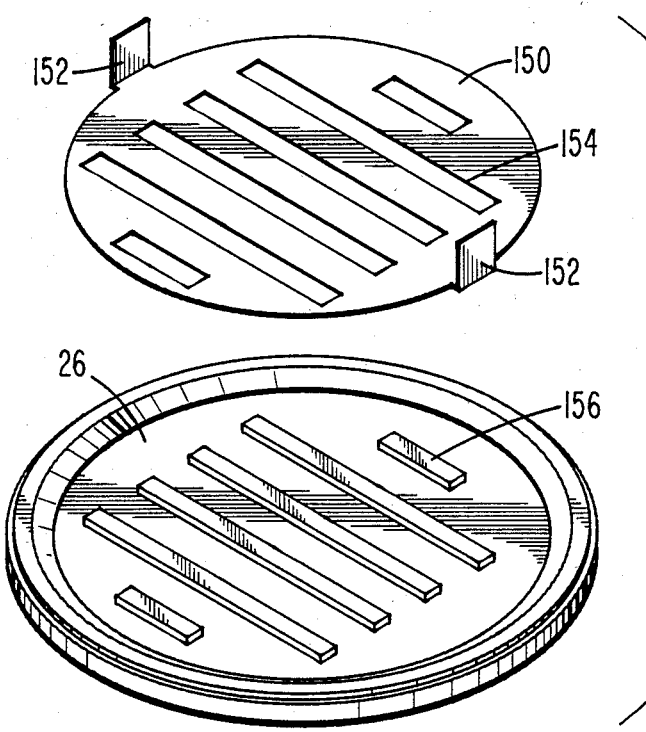

Referring to FIG. 3, there is shown a modification of the apparatus of the present invention for use in coating the entire surface of the object except for certain selected areas rather than coating the selected spaced areas. This apparatus is identical to the apparatus shown in FIGS. 1 and 2 except that the openings 154 in the mask 150 are arranged to coincide with the areas of the object not to be coated. After the mask 150 is positioned with the openings 154 properly aligned with the areas of the object surface not to be coated, separate metal members 156 in the form of blocks of the same size and shape as the openings 154 are placed in the openings 154. The metal blocks 156 are held to the surface of the object by the magnet. The mask 150 is then carefully lifted away by the tabs 152 to leave the masking blocks 156 on the surface of the object but exposing the major portion of the object surface as shown in FIG. 4. The support member can then be placed in the coating chamber to coat the exposed surface of the object.

Thus, there is provided by the present invention an apparatus for use in coating a selected area of the surface of an object which firmly holds the object and allows a mask to be placed over the surface to be coated with the openings in the mask being aligned with the appropriate areas of the surface of the object. The mask is then held to the object by the magnet to permit applying the coating to the exposed areas of the object surface.

I claim:

1. Apparatus for coating a selected area of the surface of a body comprising
   a support member having a recess in one side which is adapted to receive the body and an opening extending therethrough from the bottom of the recess to expose the surface of the body to be coated, said opening being smaller than the bottom of the recess,
   means for securing the body against the bottom of the recess with the surface of the body exposed through the opening including a cover plate having a portion adapted to fit in the recess to engage the body and hold the body against the bottom of the recess and a rim extending over the surface of the support member around the recess and means for securing the cover plate to the support member,
   a mask adapted to fit in the opening against said surface of the body, and
   a magnet adapted to be seated on the securing means to hold the mask against the surface of the body.

2. Apparatus in accordance with claim 1 in which the cover plate is cup-shaped having a flat bottom, a wall extending from the bottom and a rim extending outwardly from the end of the wall.

3. Apparatus in accordance with claim 2 in which the bottom of the cover plate has an opening therethrough.

4. Apparatus in accordance with claim 3 in which the magnet is a disc adapted to fit within the wall of the cover plate and against the bottom and has an opening therethrough which can be aligned with the opening in the cover plate.

5. Apparatus in accordance with claim 1 in which the mask includes a thin plate of a magnetic material having at least one opening therethrough and a pair of handling tabs projecting from the edges of the disc.

6. Apparatus in accordance with claim 5 in which the mask also includes at least one body of a magnetic material which is of a shape and size to fit into an opening in the plate.

7. Apparatus in accordance with claim 1 in which the support member has a pair of spaced alignment pins extending from the bottom of the recess and spring means for engaging the body to hold it against the alignment pins.

* * * * *